(12) United States Patent
Banba

(10) Patent No.: US 7,768,348 B2
(45) Date of Patent: Aug. 3, 2010

(54) HIGH-FREQUENCY CIRCUIT

(75) Inventor: Seiichi Banba, Ogaki (JP)

(73) Assignee: Sanyo Electric Co., Osaka (JP)

( * ) Notice: Subject to any disclaimer, the term of this patent is extended or adjusted under 35 U.S.C. 154(b) by 0 days.

(21) Appl. No.: 12/144,103

(22) Filed: Jun. 23, 2008

(65) Prior Publication Data

US 2009/0009244 A1 Jan. 8, 2009

(30) Foreign Application Priority Data

Jun. 22, 2007 (JP) ............................. 2007-164802

(51) Int. Cl.
*H03F 3/45* (2006.01)
(52) U.S. Cl. ........................................ 330/253; 333/32
(58) Field of Classification Search .................. 330/253, 330/277, 302–306

See application file for complete search history.

(56) References Cited

U.S. PATENT DOCUMENTS

2007/0139117 A1 * 6/2007 Iida ............................ 330/277

FOREIGN PATENT DOCUMENTS

JP 2005-175819 6/2005

OTHER PUBLICATIONS

Matthaei, G. et al., "Microwave Filters, Impedance-Matching Networks, and Coupling Structures," 1980, pp. 95-104, pp. 438-440.

* cited by examiner

*Primary Examiner*—Robert Pascal
*Assistant Examiner*—Hieu P Nguyen
(74) *Attorney, Agent, or Firm*—McDermott Will & Emery LLP

(57) ABSTRACT

The potential of a source terminal of a transistor is fixed; a load is connected to a drain terminal of the transistor; and an input signal is received by a gate terminal of the transistor. A series circuit including an inductor and a capacitor connected in series is provided between a connection point of the drain terminal of the transistor and the load and an output terminal of a high-frequency circuit. A band-pass filter having a prescribed characteristic is configured by an output equivalent circuit expressing an output impedance of the transistor, the load, and the series circuit.

14 Claims, 15 Drawing Sheets

10

20

55

HIGH-FREQUENCY CIRCUIT

CROSS-REFERENCE TO RELATED APPLICATIONS

This application is based upon and claims the benefit of priority from the prior Japanese Patent Application No. 2007-164802, filed on Jun. 22, 2007, the entire contents of which are incorporated herein by reference.

BACKGROUND OF THE INVENTION

1. Field of the Invention

The present invention relates to a high-frequency circuit applied to a transmitting circuit operating in a GHz band frequency and the like.

2. Description of the Related Art

High gain and high output power are essential features of amplifiers, output amplifiers in particular, to be used in GHz bands. It is vital that the output matching is met in the band in use. If the output matching is insufficient, unwanted reflection may be caused in an external circuit such as an antenna and therefore abnormal oscillation or the like can occur in circuitry. For the output amplifiers used in a communication scheme such as an ultra wide band (UWB), the output matching needs to be met over the entire band.

SUMMARY OF THE INVENTION

A feedback amplifier and a distributed amplifier are used as an amplifier where output matching is achieved over a wide band. For such an amplifier, problems to be addressed by the present invention include increase in circuit area and power consumption.

A high-frequency circuit according to one embodiment of the present invention comprises: a transistor wherein the potential of a source terminal thereof is fixed and an input signal is received by a gate terminal thereof; a load connected to a drain terminal of the transistor; and a series circuit, including an inductor and a capacitor connected in series, provided between a connection point of the drain terminal of the transistor and the load and an output terminal of the high-frequency circuit, wherein a band-pass filter having a predetermined characteristic is configured by an output equivalent circuit expressing an output impedance of the transistor, the load, and the series circuit.

Optional combinations of the aforementioned constituting elements, and implementations of the invention in the form of methods, apparatuses, systems, and so forth may also be practiced as additional modes of the present invention.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1A:
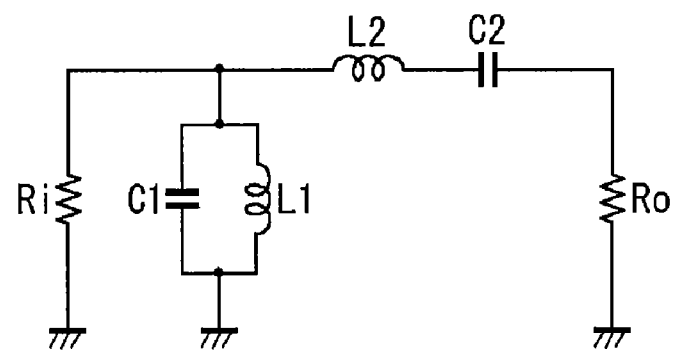
FIG. 1A shows a circuit configuration of a second-order Butterworth type BPF used in an embodiment.

The invention will now be described by reference to the preferred embodiments. This does not intend to limit the scope of the present invention, but to exemplify the invention.

With reference to the Figures, the invention will now be described based on the following exemplary embodiments. The same or equivalent components, members and processings shown in Figures are given the identical reference numerals and the repeated description thereof will be omitted as appropriate. The following embodiments do not intend to limit the scope of the present invention but exemplify the invention, and all of the features and the combinations thereof described in the embodiments are not necessarily essential to the invention.

A description is given hereinbelow of an outline of a wideband output amplifier according to an embodiment of the present invention. This output amplifier is suitable for silicon radio-frequency integrated circuits (RFICs) and is provided with a differential amplifier circuit and a preamplifier circuit, having one or more stages, provided before the differential amplifier circuit. The differential amplifier circuit used here is often used as a fundamental amplifier circuit of a silicon RFIC produced through a CMOS (Complementary Metal Oxide Semiconductor) process.

Using the differential amplifier circuit and the preamplifier circuit, a description is given hereunder of fundamentals to realize an amplifier having excellent output matching and flat gain over a wide band, without increase in circuit area and power consumption.

Firstly, a band-pass filer (BPF) having a desired band is provided between a drain terminal of a transistor constituting the differential amplifier circuit and an output terminal of the output amplifier. To achieve the desired BPF characteristics, utilized herein is the fact that an output equivalent circuit expressing an output impedance of the differential amplifier circuit can be approximated as a parallel circuit in which a resistor and a capacitor are connected in parallel. The desired BPF characteristics are achieved using these internal equivalent circuits of this differential amplifier circuit, an inductor, a capacitor and a resistor provided in parallel between a drain terminal of this differential amplifier circuit and a power supply terminal, and an inductor and a capacitor provided between the aforementioned drain terminal and the aforementioned output terminal. Also, a load circuit in the preamplifier circuit is configured by inductive elements, so that the flatness within the band can be achieved by adjusting this load circuit.

The fundamentals of an amplifier, according to an embodiment, provided with the wide-band output matching are hereinbelow described in detail.

A description is first given of how to configure a BPF (I).

The center frequency, the band and the order are important design factors to be considered when designing a BPF comprising lumped elements L and C. More specifically, the BPF may be classified into a Butterworth type, a Chebyshev type and so forth according to the band-pass characteristic. The value of an inductor L and the value of a capacitor C can be determined depending on the type used.

Figure 1B:
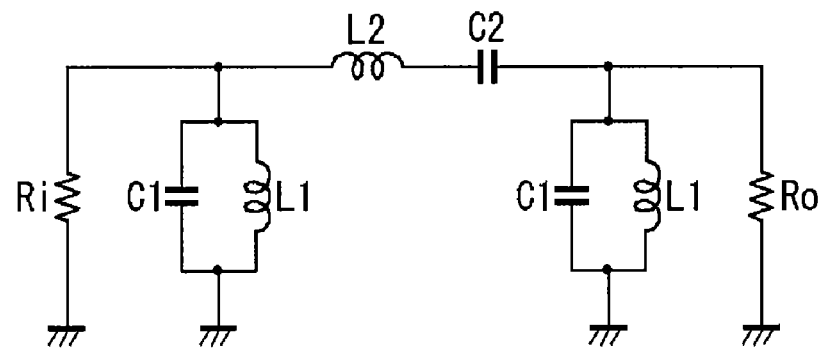
FIG. 1B shows a circuit configuration of a third-order Chebyshev type BPF used in an embodiment.

FIGS. 1A and 1B illustrate circuit configurations of a second-order and a third-order BPF using inductors L and capacitors C. FIG. 1A shows a circuit configuration of a second-order Butterworth type BPF 10 used in the embodiment. In the second-order Butterworth type BPF 10, a second inductor L2 and a second capacitor C2 are connected in series between an input resistor Ri and an output resistor Ro. A first capacitor C1 and a first inductor L1 are connected in parallel between a connection point of the input resistor Ri and the second inductor L2 and a predetermined first fixed potential, which is the ground here.

The input resistor Ri and the output resistor Ro are reference impedances, and are both generally set to 50Ω. The values of the first inductor L1, the first capacitor C1, the second inductor L2 and the second capacitor C2 are defined as in the following Equation (1). Note that $\omega_L$, $\omega_H$, $\omega_{BW}$ and $\omega_C$ denote the angular frequencies of a lower-side cutoff frequency, a higher-side cutoff frequency, a bandwidth and a center frequency, respectively, in the following Equation (1).

$$L_1 = \frac{\omega_{BW} R_O}{k\omega_C^2}, C_1 = \frac{k}{\omega_{BW} R_O}, \quad \text{Equation (1)}$$

$$L_2 = \frac{kR_O}{\omega_{BW}}, C_2 = \frac{\omega_{BW}}{k\omega_C^2 R_O}$$

$$\because k = \sqrt{2}, \omega_C = \sqrt{\omega_L \cdot \omega_H}, \omega_{BW} = \omega_H - \omega_L$$

FIG. 1B shows a circuit configuration of a third-order Chebyshev type BPF 20 used in the embodiment. The structure of this third-order Chebyshev type BPF 20 is configured such that a parallel circuit where a first capacitor C1 and a first inductor L1 are connected in parallel between a connection point between the second capacitor C2 and the output resistor Ro and first the predetermined fixed potential, which is the ground, is additionally inserted to the above-described second-order Butterworth type BPF 10.

The values of the first inductor L1, the first capacitor C1, the second inductor L2 and the second capacitor C2 are defined as in the following Equation (2). Note that $\omega_L$, $\omega_H$, $\omega_{BW}$ and $\omega_C$ denote the angular frequencies of a lower-side cutoff frequency, a higher-side cutoff frequency, a bandwidth and a center frequency, respectively, in the following Equation (2). Also, $g_1$ and $g_2$ are g-parameters of BPF, and in the Chebyshev type filter these parameters can be determined from the order or a ripple value.

$$L_1 = \frac{\omega_{BW} R_O}{g_1 \omega_C^2}, C_1 = \frac{g_1}{\omega_{BW} R_O}, \quad \text{Equation (2)}$$

$$L_2 = \frac{g_2 R_O}{\omega_{BW}}, C_2 = \frac{\omega_{BW}}{g_2 \omega_C^2 R_O}$$

$$\because \omega_C = \sqrt{\omega_L \cdot \omega_H}, \omega_{BW} = \omega_H - \omega_L, g_1 \neq g_2$$

The g-parameters and the determination of BPF constants are discussed in "Microwave Filters, Impedance-Matching Networks and Coupling Structure" written by G. Matthaei et al. (1980) and other documents.

Figure 2A:
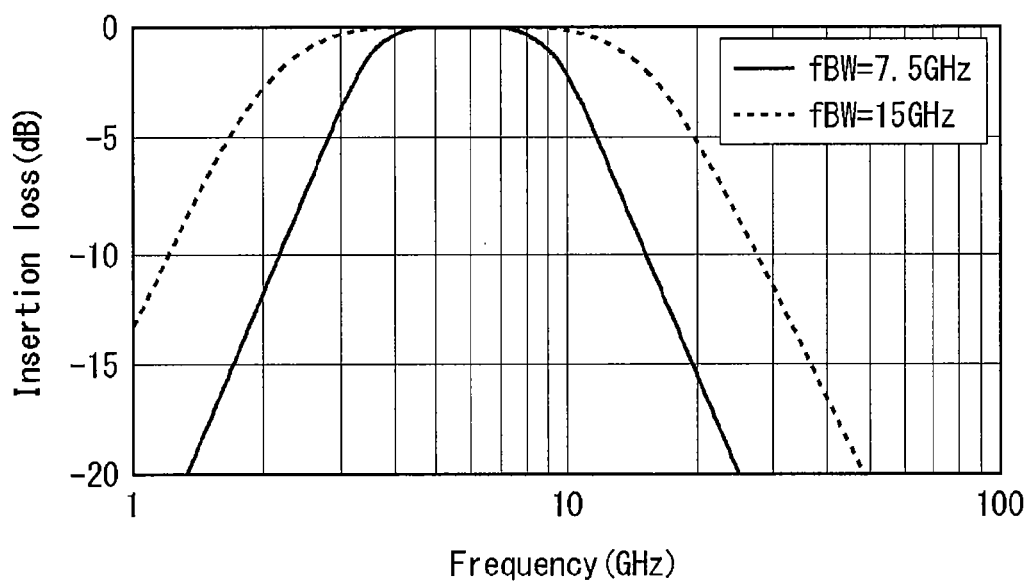
FIGS. 2A and 2B show frequency characteristics of a second-order Butterworth type BPF.
Figure 2B:
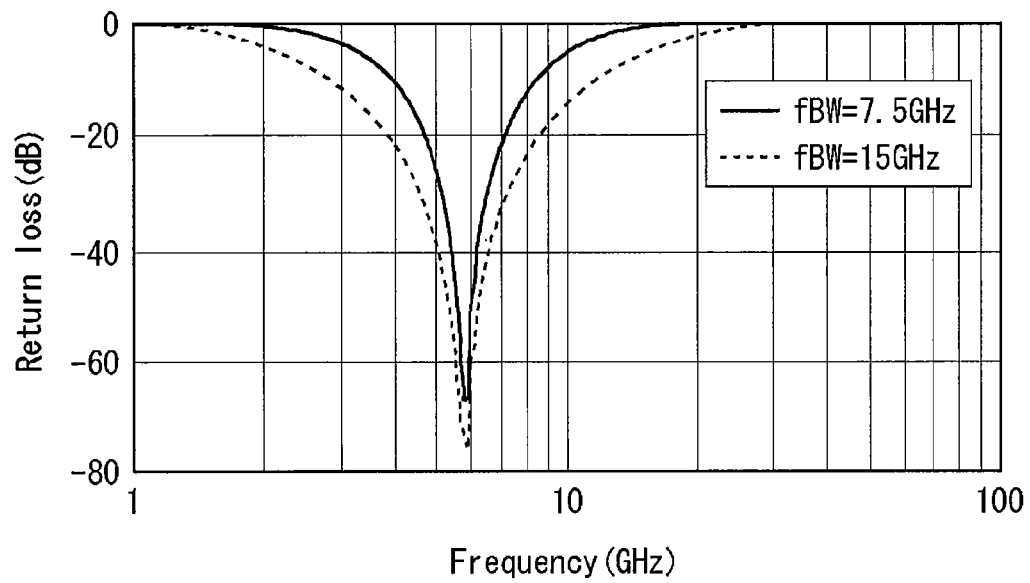

FIGS. 2A and 2B show frequency characteristics of a second-order Butterworth type BPF 10. FIG. 2A shows insertion loss characteristics of the second-order Butterworth type BPF 10, whereas FIG. 2B shows return loss characteristics of the second-order Butterworth type BPF 10. An example is given here where the angular frequency $\omega_L$ indicating the lower-side cutoff frequency is set to 3.1 GHz and the angular frequency $\omega_H$ of the higher-side cutoff frequency is set to 10.6 GHz. In this example, each value is set as follows. The first inductor L1=1.284 nH, the first capacitor C1=0.600 pF, the second inductor L2=1.500 nH, and the second capacitor C2=0.514 pF. Note that the reference impedance is 50Ω.

Though the bandwidth $\omega_{BW}$ is 7.5 GHz, the band-pass characteristics at the both edges drop by 3 dB. Thus it will be more realistic if the center frequency is fixed and then a band about twice as much as a desired band is set. For example, when the center frequency $\omega_C$ and the bandwidth $\omega_{BW}$ are set to 5.732 GHz and 15 GHz, respectively, the first inductor L1=2.569 nH, the first capacitor C1=0.300 pF, the second inductor L2=0.750 nH, and the second capacitor C2=1.027 pF.

If such BPF as described above is configured between the differential amplifier circuit constituting the output amplifier and the output terminal of this output amplifier, a wide-band output matching can be achieved.

A description is now given of an equivalent circuit between the differential circuit and the output terminal (II).

Figure 3:
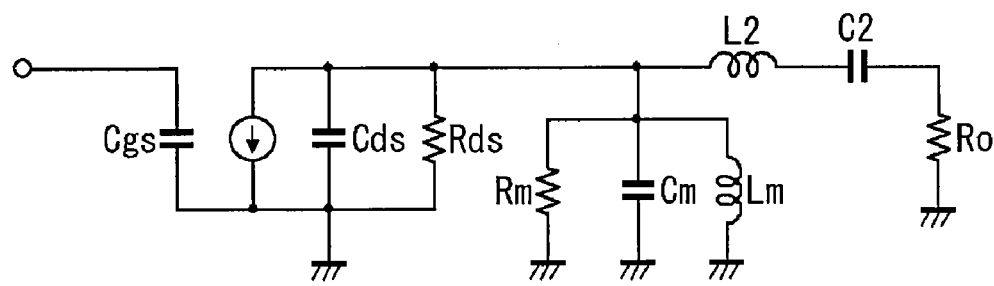
FIG. 3 is an equivalent circuit showing the fundamentals of output matching according to an embodiment.

FIG. 3 is an equivalent circuit showing the fundamentals of output matching according to the present embodiment. An output equivalent circuit in the differential amplifier circuit can be approximated by a parallel circuit where a source-to-drain resistor Rds and a source-to-drain capacitor Cds are connected in parallel. As a load of the differential amplifier circuit, a parallel circuit, wherein a resonant load resistor Rm, a resonant load capacitor Cm and a resonant load inductor Lm (Lout) are connected in parallel, are inserted between the differential amplifier circuit and the power supply terminal. An output inductor Ls (L2) and an output capacitor Cs (C2) are inserted between the differential amplifier circuit and the output terminal of the output amplifier. Based on the assumption of these structures, the circuit constants viewed from the differential amplifier circuit side are expressed by the following Equation (3). The power supply terminal for supplying the power supply voltage is generally grounded in terms of alternating current. Similarly, it can be taken that the respective source terminals of the differential amplifier circuit are grounded in terms of alternating current.

$$C_{out} = C_{ds} + C_m \quad \text{Equation (3)}$$

$$R_{out} = \frac{R_{ds} \cdot R_m}{R_{ds} + R_m}$$

$$L_{out} = L_m$$

Suppose that, as shown in the following Equation (4), a combined capacitance Cout, a combined resistance Rout and the resonant load inductor Lm (Lout) expressed in the above Equation (3), the output inductor Ls (L2) and the output capacitor Cs (C2) are set to the values of the first capacitor C1, the output resistor Ro, the first inductor L1, the second inductor L2 and the second capacitor C2 evaluated in the above Equation (1) and Equation (2), respectively. Then a desired BPF can be configured between the differential amplifier circuit and the output terminal of the output amplifier. It is comparatively easy to achieve these circuit constants as will be explained in conjunction with exemplary embodiments discussed later. The antenna impedance generally is 50Ω. If it is not 50Ω, the reference impedance of BPF may be adjusted to the antenna impedance.

$$R_{out} = R_O = 50\Omega$$

$$L_1 = L_{out} = L_m$$

$$C_1 = C_{out}$$

$$L_2 = L_S$$

$$C_2 = C_S \quad \text{Equation (4)}$$

Next, a description is given of a frequency characteristic of gain (III).

In a wide-band amplifier, desired is the frequency characteristic such that the gain is flat in the band and the gain drops outside the band.

Figure 4:
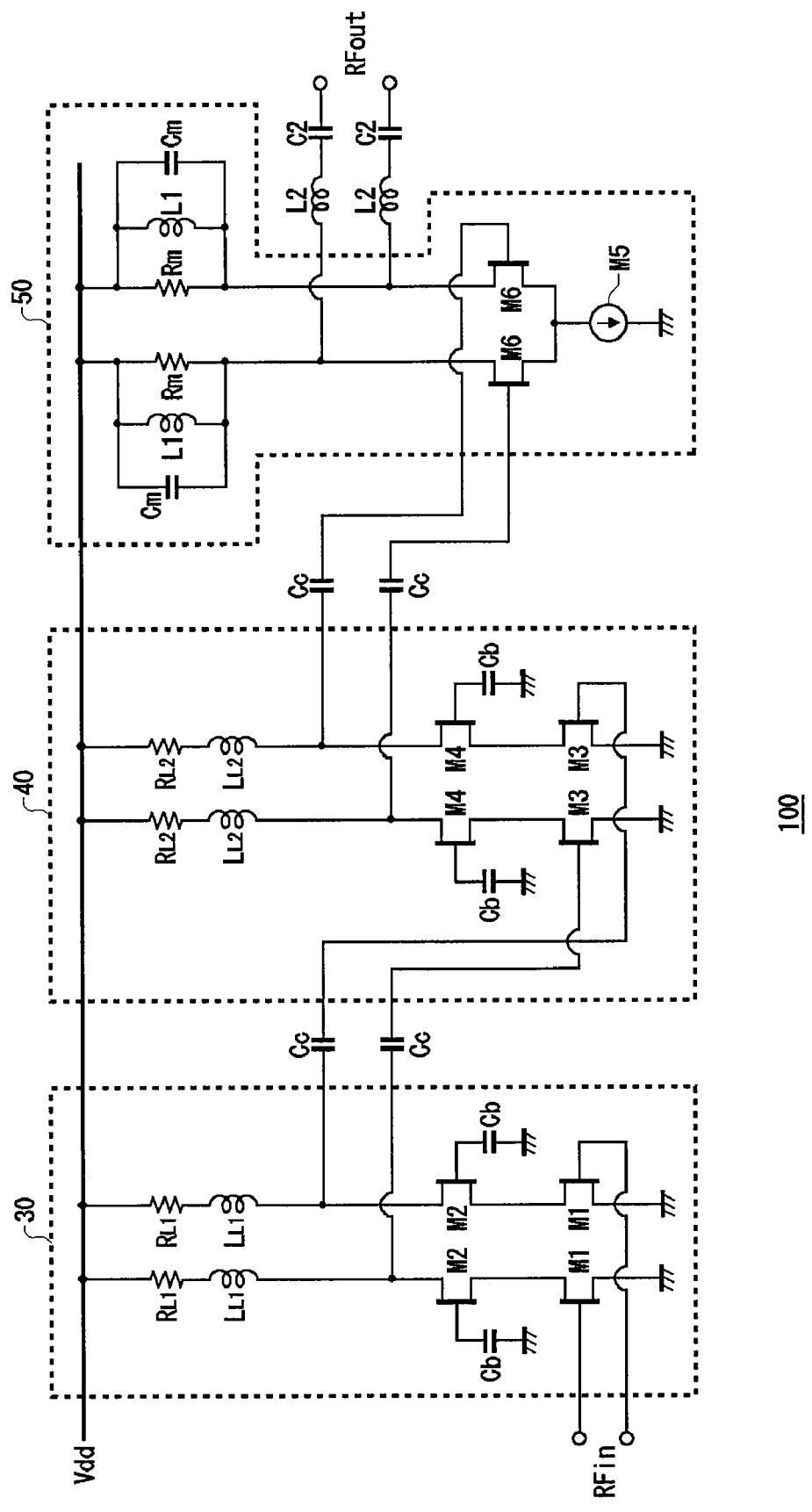
FIG. 4 shows a general configuration of an output amplifier according to an embodiment.

FIG. 4 shows a general configuration of an output amplifier 100 according to the present embodiment. The output amplifier 100 includes two stages of preamplifier circuits 30 and 40 provided before a differential amplifier circuit 50. The preamplifier circuits 30 and 40 are each configured by a differential cascade amplifier circuit. For simplicity of explanation, the same reference numeral is hereinbelow given to a differential pair of two elements and a description will be given based on the assumption of a single configuration.

The first preamplifier circuit 30 includes a first transistor M1, a second transistor M2, a first load inductor $L_{L1}$, and a first load resistor $R_{L1}$. In the circuit configuration shown in FIG. 4 and those shown after FIG. 4, a description is given of an example where n-channel MOSFETs (Metal-Oxide Semiconductor Field-Effect Transistor) are used. Note that these n-channel MOSFETs operate in a saturated region. Note again that there are a pair of transistors but the description thereof is given here and hereinafter as a single structure instead.

The first transistor M1 is a common-source transistor; the second transistor M2 is a common-gate transistor; and the first transistor M1 and the second transistor M2 are cascode-connected. More specifically, the source terminal of the first transistor M1 is connected to a first predetermined fixed potential, which is the ground in FIG. 4, whereas a drain terminal of the first transistor M1 is connected to a source terminal of the second transistor M2. A gate terminal of the first transistor M1 receives a high-frequency input signal RFin.

A gate terminal of the second transistor M2 is connected to the first predetermined fixed potential, which is the ground in FIG. 4, by way of a bypass capacitor Cb. A drain terminal of the second transistor M2 is connected to a load including the first load inductor $L_{L1}$ and the first load resistor $R_{L1}$ which are connected in series to each other. The other end of the load is connected to a second predetermined fixed potential, which is a supply potential Vdd in FIG. 4.

The first transistor M1 and the second transistor M2, which are connected in cascode to each other, convert the high-frequency input signal RFin into output current. The output current is converted to output voltage by the operation of the aforementioned load. This output voltage is outputted to the second preamplifier circuit 40 via a coupling capacitance Cc.

The second preamplifier circuit 40 includes a third transistor M3, a fourth transistor M4, a second load inductor $L_{L2}$, and a second load resistor $R_{L2}$. The output voltage of the first preamplifier circuit 30 is received by a gate terminal of the third transistor M3. The configuration of the second preamplifier circuit 40 is similar to that of the first preamplifier circuit 30 and therefore the repeated description thereof is omitted here. The output voltage of the second preamplifier circuit 40 is outputted to the differential amplifier circuit 50 via a coupling capacitance Cc.

The differential amplifier circuit 50 includes a constant-current source M5, a sixth transistor M6, a resonant load capacitor Cm, a first inductor L1 (resonant load inductor Lm), and a resonant load resistor Rm. One end of the constant-current source M5 is connected to the first predetermined fixed potential, which is the ground in FIG. 4, whereas the other end of the constant-current source M5 is connected to a source terminal of the sixth transistor M6. As will be shown in FIG. 7, the constant-current source M5 may be configured by a common-source transistor.

A drain terminal of the sixth transistor M6 is connected to a resonator load, whereas a gate of the sixth transistor M6 receives the output voltage of the preceding second preamplifier circuit 40. The resonator load is configured by a parallel circuit including the resonant load capacitor Cm, the first inductor L1 and the resonant load resistor Rm connected in parallel. The other end of the resonator load is connected to the second predetermined fixed potential, which is the supply potential Vdd in FIG. 4.

A second inductor L2 and a second capacitor C2 are connected in series between a connecting point between the sixth transistor M6 and the resonator load and an output terminal of the output amplifier 100. Note that a bias circuit is omitted in FIG. 4. By employing the above-described structure, the above-described BPF is constructed between the differential amplifier circuit 50 and the output terminal of the output amplifier 100.

Figure 5:
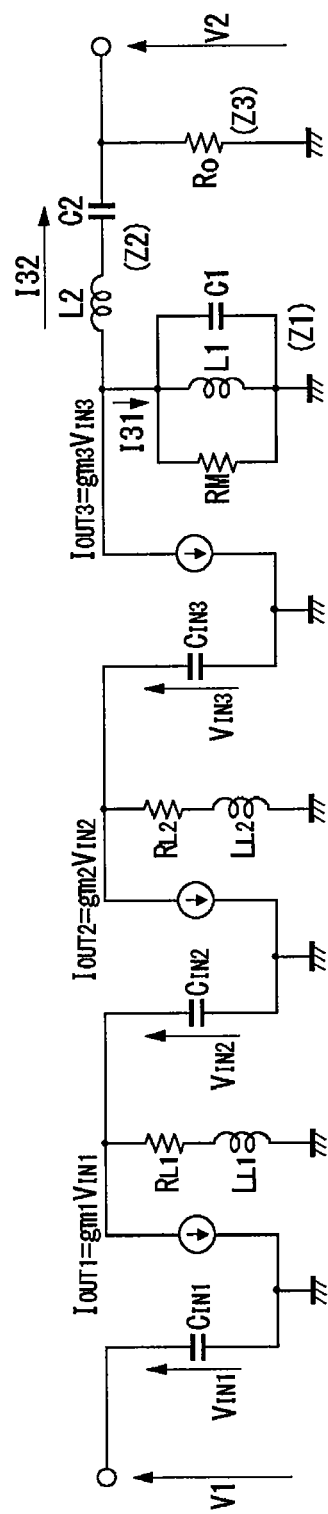
FIG. 5 shows an equivalent circuit model to derive a transfer function of an output amplifier as shown in FIG. 4.

FIG. 5 shows an equivalent circuit model to derive a transfer function of the output amplifier 100 as shown in FIG. 4. Assume that the constant of the BPF constructed in the output amplifier 100 is set to that of the above-described second-order Butterworth type BPF. In case the reference impedances differ, the resonant load resistor Rm and the output resistor Ro across the BPF are set as another parameters.

Equations for a circuit as shown in FIG. 5 will be expressed by the following Equation (5).

$$V_1 = V_{IN1} \quad \text{Equation (5)}$$

$$I_{OUT1} = g_{m1} V_{IN1}$$

$$V_{IN2} = \frac{Z_{L1} Z_{IN2}}{Z_{L1} + Z_{IN2}} I_{OUT1}$$

$$I_{OUT2} = g_{m2} V_{IN2}$$

$$V_{IN3} = -\frac{Z_{L2} Z_{IN3}}{Z_{L2} + Z_{IN3}} I_{OUT2}$$

$$I_{OUT3} = g_{m3} V_{IN3}$$

$$I_{OUT3} = -(I_{31} + I_{32})$$

-continued $$I_{32} = (I_{31} + I_{32})\frac{Z_1}{Z_1 + Z_2 + Z_3}$$

$$V_2 = I_{32}Z_3$$

$$V_2 = -\frac{Z_1 Z_3}{Z_1 + Z_2 + Z_3} I_{OUT3}$$

$$\because Z_{IN2} = \frac{1}{j\omega C_{IN2}}, Z_{IN3} = \frac{1}{j\omega C_{IN3}},$$

$$Z_{L1} = R_{L1} + j\omega L_{L1}, Z_{L2} = R_{L2} + j\omega L_{L2}$$

$$Z_1 = \frac{1}{\frac{1}{R_m} + \frac{1}{j\omega L_1} + j\omega C_1},$$

$$Z_2 = j\omega L_2 + \frac{1}{j\omega C_2}, Z_3 = R_O$$

Thus, the transfer function is expressed by the following Equation (6).

$$\frac{V_2}{V_1} = \left(-\frac{Z_1 Z_3}{Z_1 + Z_2 + Z_3}\right) g_{m3} \times \quad \text{Equation (6)}$$

$$\left(-\frac{Z_{L1} Z_{IN2}}{Z_{L1} + Z_{IN2}}\right) g_{m1} \times \left(-\frac{Z_{L2} Z_{IN3}}{Z_{L2} + Z_{IN3}}\right) g_{m2}$$

In solving the above Equation (6), the relations in the above Equation (1) are used, so that the frequency characteristics of the transfer function can be specifically obtained as indicated by the following Equation (7).

$$\left|\frac{V_2}{V_1}\right| = \frac{\sqrt{A^2(R_O + R_M)^2 + \left(BR_M - R_M A^2 \frac{1}{B} + BR_O\right)^2}}{A^2(R_O + R_M)^2 + \left(BR_M - R_M A^2 \frac{1}{B} + BR_O\right)^2} BR_M R_O g_{m3} \times \quad \text{Equation (7)}$$

$$\frac{\sqrt{R_{L1}^2 D^4 + D^2(C^2 - CD + R_{L1}^2)^2}}{R_{L1}^2 + (C - D)^2} g_{m1} \times$$

$$\frac{\sqrt{R_{L2}^2 F^4 + F^2(E^2 - EF + R_{L2}^2)^2}}{R_{L2}^2 + (E - F)^2} g_{m2}$$

$$\because A \equiv 1 - \left(\frac{\omega}{\omega_C}\right)^2, B \equiv \frac{\omega}{k}\frac{\omega_{BW}}{\omega_C^2}, C \equiv \omega L_{L1},$$

$$D \equiv \frac{1}{\omega C_{IN2}}, E \equiv \omega L_{L2}, F \equiv \frac{1}{\omega C_{IN3}}$$

As shown in the above Equation (7), the transfer function of the entire output amplifier is complicated. Thus, the behavior thereof is now explained using the numerical computation. If the above Equation (7) is thought of in units of dB, it can be broken down to a first to a third term.

Figure 6:
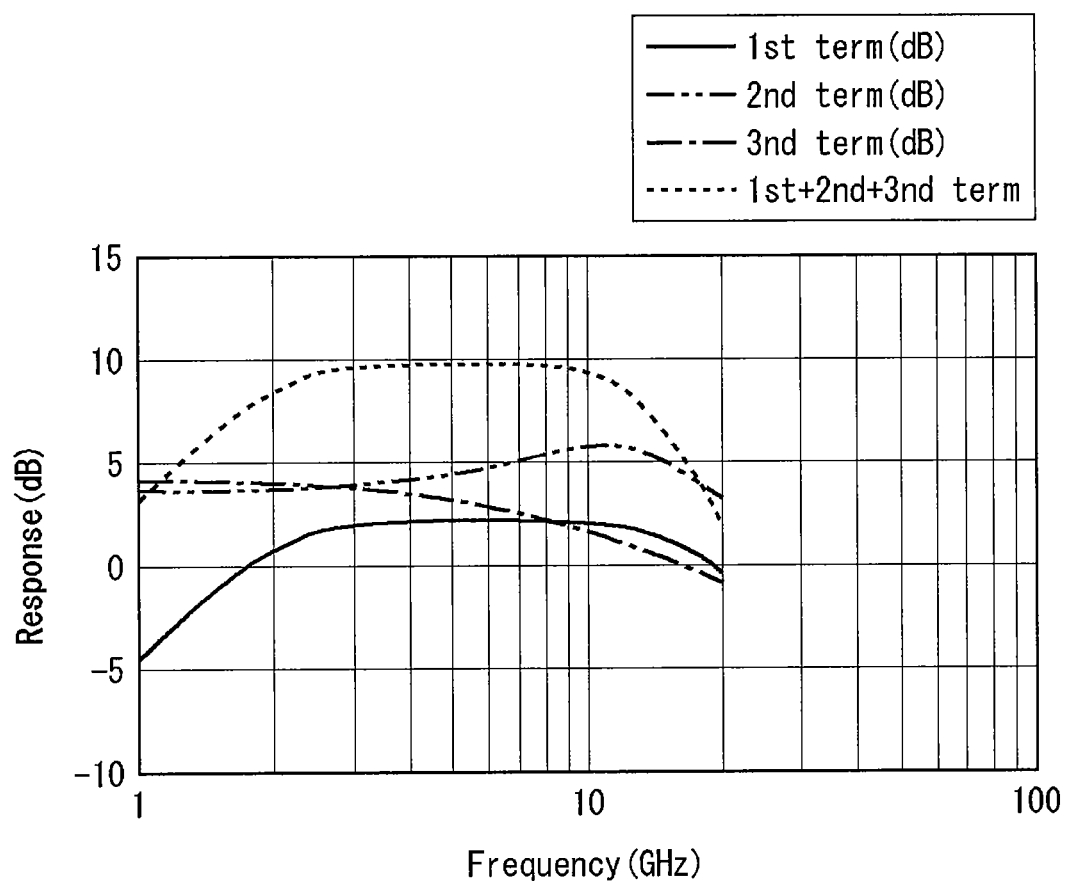
FIG. 6 shows the frequency dependencies of a first term, a second term and a third term of a transfer function, and the frequency dependency of the sum of the first to third terms thereof.

FIG. 6 shows the frequency dependencies of the first term, the second term and the third term of the transfer function, and the frequency dependency of the sum of the first to third terms thereof. In the computation of the transfer function, the following values are used: $k=\sqrt{2}$, $\omega C=5.732$ GHz, $\omega BW=15$ GHz, $g_{m1}=g_{m2}=32.5$ mS, $g_{m3}=65$ mS, $C_{IN1}=C_{IN2}=170$ fF, $C_{IN3}=340$ fF, $R_{L1}=70\Omega$, $L_{L1}=1.0$ nH, $R_{L2}=80\Omega$, $L_{L2}=0.25$ nH, and $R_M=R_O=50\Omega$.

The first term derived from a BPF unit is flat in the band, thus exhibiting a desirable characteristic. However, since the second and the third term indicating the first-stage and the second-stage preamplifier unit, respectively, have their own frequency responses, it is difficult to make the frequency characteristics flat over the wide band. On the other hand, the frequency characteristic of the total sum of the first to third terms can be so adjusted as to be flat. If a desired band is even wider, another preamplifier may be added. As described above, it has been demonstrated that both a satisfactory output matching and a flat gain in the desired band can be achieved by the use of the output amplifier 100 as shown in FIG. 4. Based on this knowledge, exemplary embodiments will now be explained hereinbelow.

Figure 7:
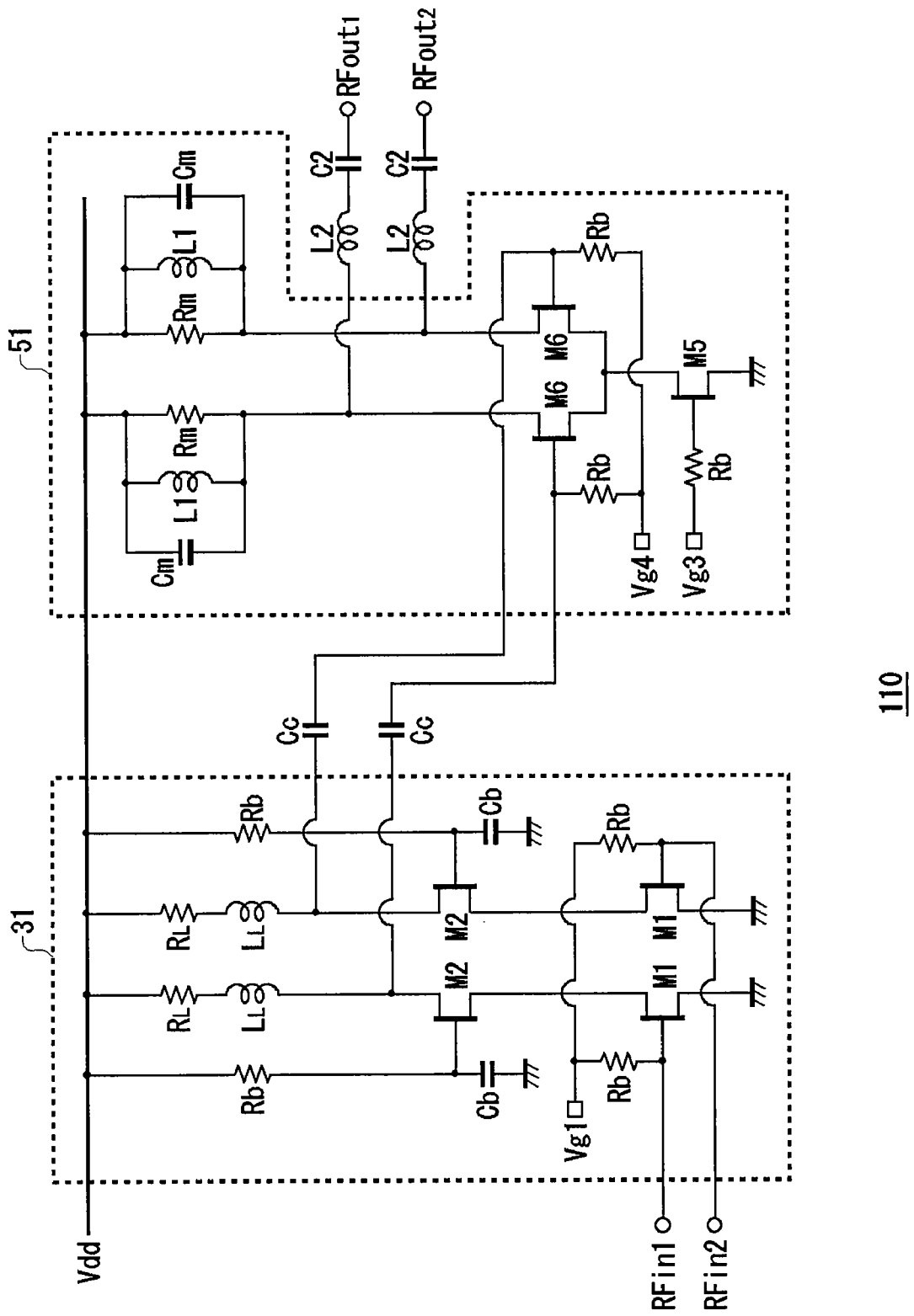
FIG. 7 shows a circuit configuration of an output amplifier loaded with a second-order BPF according to a first exemplary embodiment.

FIG. 7 shows a circuit configuration of the output amplifier 110 loaded with the second-order BPF according to a first exemplary embodiment. The output amplifier 110 shown in FIG. 7 is structured such that the preamplifier circuit of the output amplifier 100 shown in FIG. 4 is turned into one stage. Also, a bypass circuit is added in FIG. 7. A first bias voltage Vg1 is applied to the gate terminal of the first transistor M1 via a bias resistor Rb. The power supply voltage Vdd is applied to the gate terminal of the second transistor M2 via a bias resistor Rb.

In the case of FIG. 7, the constant-current source M5 of FIG. 4 is configured by a fifth transistor of FIG. 7. A source terminal of the fifth transistor M5 is connected to the first predetermined fixed potential, which is the ground in FIG. 7, whereas a drain terminal of the fifth transistor M5 is connected to a source terminal of a sixth transistor M6. A third bias voltage Vg3 is applied to a gate terminal of the fifth transistor M5 via a bias resistor Rb. A fourth bias voltage Vg4 is applied to a gate terminal of the sixth transistor M6 via a bias resistor Rb.

In this configuration, a desired band is set to 3 to 5 GHz. In a differential amplifier circuit 51, each value is set as follows. The gate length of the sixth transistor M6=0.18 um; the gate width of the sixth transistor M6=200 um; the gate length of the fifth transistor M5=0.18 um; the gate width of the fifth transistor M5=300 um; the power supply voltage Vdd=1.8 V; the gate voltage of the sixth transistor M6=1.5 V; the gate voltage of the fifth transistor M5=0.7 V; and the operating current=16.4 mA.

In a preamplifier circuit 31, each value is set as follows. The gate length of a first transistor M1 and a second transistor M2=0.18 um; the gate width of the first transistor M1 and the second transistor M2=100 um; the power supply voltage Vdd=1.8 V; the gate voltage of the first transistor M1=0.7 V; the gate voltage of the second transistor M2=1.8 V; and the operating current=11.8 mA (in the state where a load circuit is being inserted). Note that a gate terminal of the second transistor M2, which is grounded through a bypass capacitor Cb, is grounded in terms of alternating current.

Next, an output equivalent circuit of the sixth transistor M6 is derived. To accurately express the operation of a high-frequency MOSFET, a model containing many parasitic components is used. The output equivalent circuit can be approximated as a parallel circuit where a source-to-drain resistor Rds and a source-to-drain capacitor Cds are connected in parallel with each other. Hence, the frequency dependency is extracted using the following Equation (8).

$$R_{ds} = \frac{1}{\text{Re}(Y_{22})}, C_{ds} = \frac{\text{Im}(Y_{22})}{\omega} \quad \text{Equation (8)}$$

In the above-described Equation (8), $Y_{22}$ is an admittance parameter viewed from the drain terminal of the sixth transistor M6. And this admittance parameter can be obtained through a simulator or the measurement of a high-frequency S-parameter.

Figure 8:
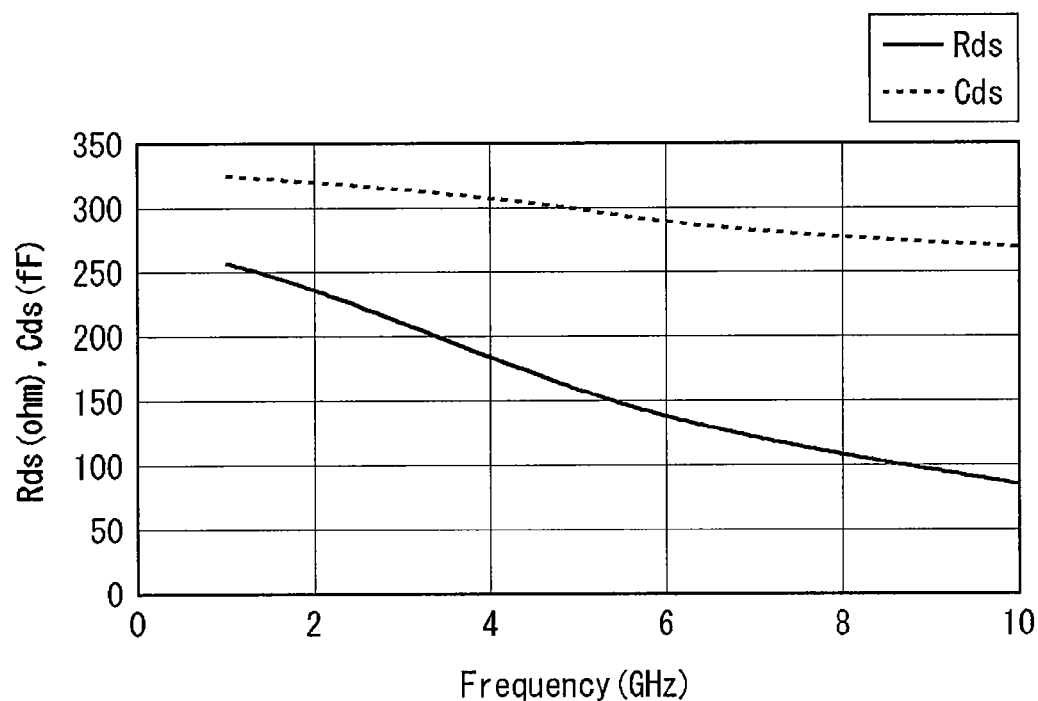
FIG. 8 shows the frequency dependency of an output equivalent circuit constant of a sixth transistor.

FIG. 8 shows the frequency dependency of an output equivalent circuit constant of the sixth transistor M6. More specifically, FIG. 8 shows the frequency dependency of the source-to-drain resistor Rds and the source-to-drain capacitor Cds viewed from the drain terminal of the sixth transistor M6. In the frequency range of 3 to 5 GHz, the source-to-drain resistor Rds varies in the range of 208.8 to 154.1Ω and the source-to-drain capacitor Cds varies in the range of 0.314 to 0.298 pF. Thus, they may be represented by the center frequency or an average value in the band or may be represented by other frequencies.

It is assumed in the present exemplary embodiment that the desired band is 3 to 5 GHz. Thus, a second-order Butterworth type BPF is used where the center frequency $\omega_C$=3.873 GHz and the bandwidth $\omega_{BW}$=8.5 GHz (the return loss at 3 to 5 GHz being also taken into account). The circuit constants of BPF according to the present specifications are listed together in the following table 1.

TABLE 1

| Center frequency of BPF | Bandwidth of BPF | Circuit constants of BPF | Return loss (3-5 GHz) |
| --- | --- | --- | --- |
| 3.873 GHz | 8.5 GHz | L1 = 3.189 nH, C1 = 0.530 pF L2 = 1.324 nH, C2 = 1.275 pF | −25 dB or below |

The load circuit of the sixth transistor M6 is determined so that the first inductance L1, the first capacitance C1, the second inductance L2 and the second capacitance C2 as given in Table 1 can be achieved. Using the values extracted in the frequency of 3 GHz, the source-to-drain capacitance Cds and the source-to-drain resistance Rds can be approximated as Cds=0.314 pF and Rds=208.8Ω. Thus, the composite values based on the above-described Equation (3) are so set as to agree with the first capacitance C1 and the output resistance Ro, where the resonant load resistor Rm and the resonant load capacitor Cm inserted between the drain terminal of the sixth transistor M6 and the power supply terminal are set to 65.7Ω and 0.216 pF, respectively.

The resonant load inductance Lm and the first inductance L1 are set equal to each other and are each set to 3.189 nH. And the second inductor L2 of 1.324 nH and the second capacitor C2 of 1.275 pF are inserted between the drain terminal of the sixth transistor M6 and the output terminal of the output amplifier 110. Further, in consideration of the frequency characteristic of gain, the load resistance RL and the load inductor LL circuit 31 are set to 60Ω and 1.0 nH, respectively, in the load circuit of the preamplifier circuit 31.

Figure 9:
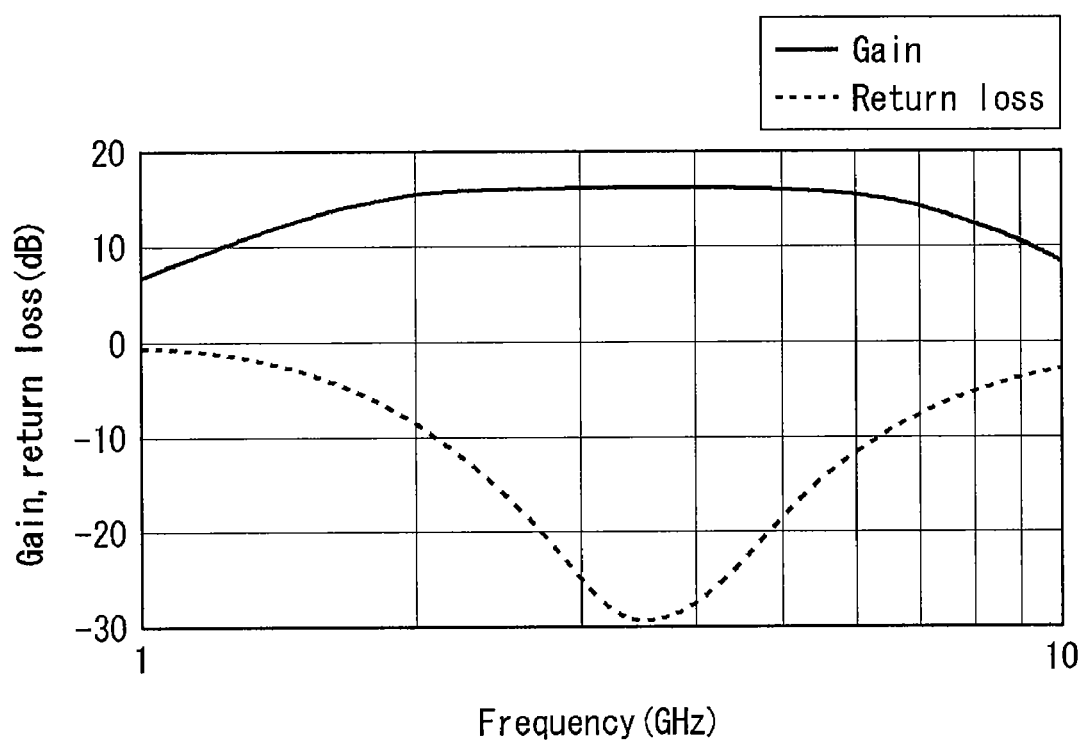
FIG. 9 shows frequency characteristics of an output amplifier according to a first exemplary embodiment.

FIG. 9 shows frequency characteristics of the output amplifier 110 according to the first exemplary embodiment. Referring to FIG. 9, in the frequency range of 3 to 5 GHz, the gain lies in the range of 16.1 to 16.2 dB, the in-band amplitude dispersion is about 0.1 dB, and the return loss is −18 dB or below. Hence, the frequency characteristics are satisfactory.

By employing the first exemplary embodiment as described above, an amplifier having excellent output matching and flat gain over a wide band can be realized without any increase in circuit area or power consumption. That is, the mere insertion of the second inductor L2 and the second capacitor C2 enables minimizing the increase in circuit area.

Figure 10:
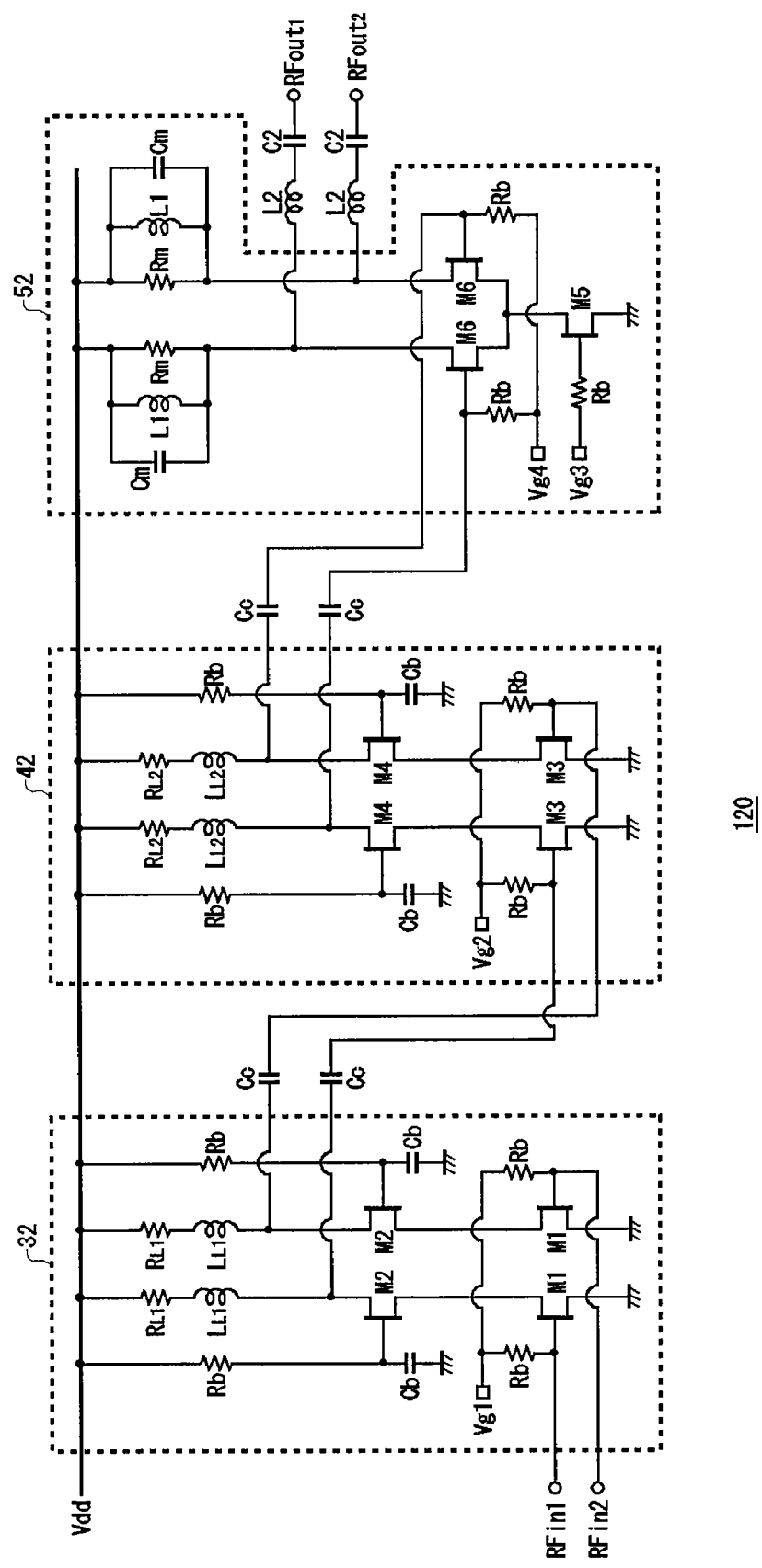
FIG. 10 shows a circuit configuration of an output amplifier loaded with a second-order BPF according to a second exemplary embodiment.

FIG. 10 shows a circuit configuration of an output amplifier 120 loaded with a second-order BPF according to a second exemplary embodiment. The output amplifier 120 shown in FIG. 10 is structured such that the preamplifier circuit of the output amplifier 110 shown in FIG. 7 is turned into two stages. A second bias voltage Vg2 is applied to the gate terminal of the third transistor M3 via a bias resistor Rb. The power supply voltage Vdd is applied to the gate terminal of the fourth transistor M4 via a bias resistor Rb.

In this configuration, a desired band is set to 3.1 to 10.6 GHz. In a differential amplifier circuit 52, each value is set as follows. The gate length of the sixth transistor M6=0.18 um; the gate width of the sixth transistor M6=100 um; the gate length of the fifth transistor M5=0.18 um; the gate width of the fifth transistor M5=200 um; the power supply voltage Vdd=1.8 V; the gate voltage of the sixth transistor M6=1.5 V; the gate voltage of the fifth transistor M5=0.7 V; and the operating current=14.2 mA.

In the second exemplary embodiment, an output equivalent circuit of the sixth transistor M6 is extracted in the center frequency (geometric average value) of the desired band, which is 5.732 GHz, whereas the source-to-drain resistor Rds is 332.8Ω and the source-to-drain capacitor Cds is 0.127 pF.

Though preamplifier circuits 32 and 42 are of a two-stage structure, the size of transistors in the first stage and the size thereof in the second stage are identical to each other. That is, each value is set as follows. The gate length of a first transistor M1, a second transistor M2, a third transistor M3 and a fourth transistor M4=0.18 um; the gate width of the first transistor M1, the second transistor M2, the third transistor M3 and the fourth transistor M4=60 um; the power supply voltage=1.8 V; the gate voltage of the first transistor M1 and the third transistor M3=0.75 V; the gate voltage of the second transistor M2 and the fourth transistor M4=1.8 V; and the operating current=9.09 mA for the first stage (in the state where load circuit is being inserted) and the operating current=9.08 mA for the second stage (in the state where load circuit is being inserted). Similar to the first exemplary embodiment, the gate terminal of the second transistor M2 and the gate terminal of the fourth transistor M4 are grounded through capacitors, so that they are grounded in terms of alternating current.

It is assumed in the second exemplary embodiment that the desired band is 3 to 5 GHz. Thus, a second-order Butterworth type BPF is used where the center frequency $\omega_C$=5.732 GHz and the bandwidth $\omega_{BW}$=15 GHz (the return loss in the desired band being also taken into account). The circuit constants of BPF according to the present specifications are listed together in the following table 2.

TABLE 2

| Center frequency of BPF | Bandwidth of BPF | Circuit constants of BPF | Return loss (3.1-10.6 GHz) |
| --- | --- | --- | --- |
| 5.732 GHz | 15 GHz | L1 = 2.569 nH, C1 = 0.300 pF L2 = 0.750 nH, C2 = 1.028 pF | −9.2 dB or below |

The load circuit of the sixth transistor M6 is determined so that the first inductance L1, the first capacitance C1, the second inductance L2 and the second capacitance C2 as given in Table 2 can be achieved. Thus, the composite values based on the above-described Equation (3) agrees with the first capacitance C1 and the output resistance Ro, provided that the resonant load resistor Rm is 58.8Ω and the resonant load capacitor Cm is 0.180 pF. The resonant load inductor Lm and the first inductor L1 are set equal to each other and are each set to 2.569 nH. And the second inductor L2 of 0.750 nH and the second capacitor C2 of 1.028 pF are inserted between the drain terminal of the sixth transistor M6 and the output terminal of the output amplifier 120. In consideration of the frequency characteristic of gain, the first load resistance $R_{L1}$, the first load inductor $L_{L1}$, the second load resistance $R_{L2}$ and the second load inductor $L_{L2}$ are set to 60Ω, 1.0 nH, 70Ω and 0.50 nH, respectively, in the load circuits of the preamplifier circuits 32 and 42.

Figure 11:
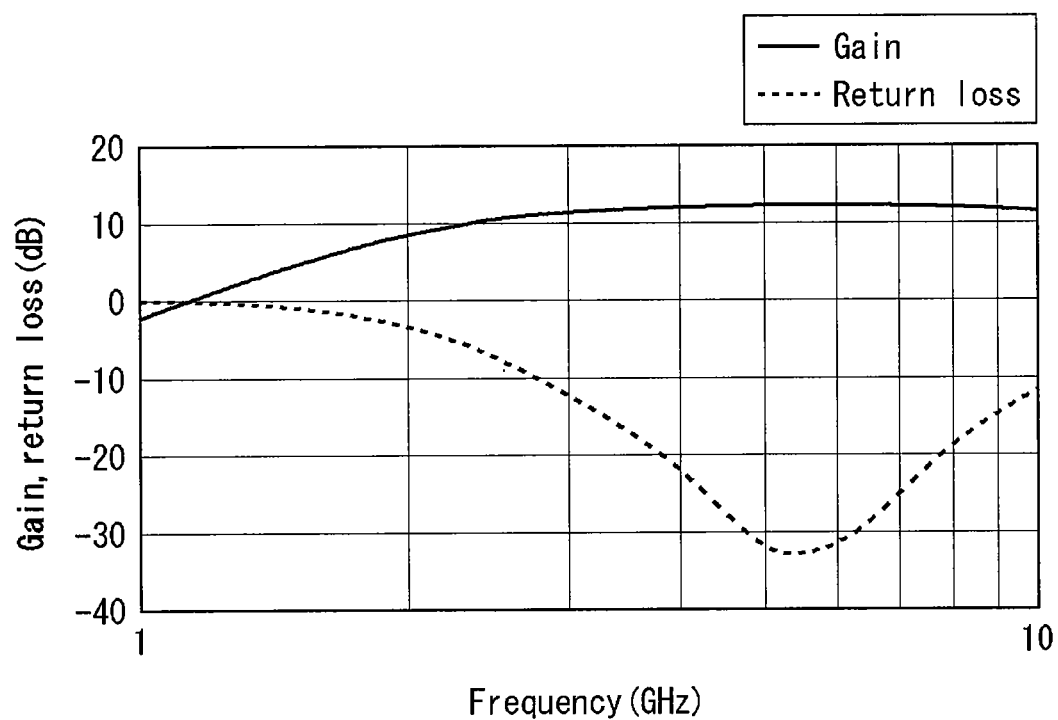
FIG. 11 shows frequency characteristics of an output amplifier according to a second exemplary embodiment.

FIG. 11 shows frequency characteristics of the output amplifier 120 according to the second exemplary embodiment. Referring to FIG. 11, in the frequency range of 3.1 to 10.6 GHz, the gain lies in the range of 11.1 to 10.7 dB, the in-band maximum value is 12.1 dB, the in-band amplitude dispersion is within 1.5 dB, and the return loss is −9.9 dB or below.

By employing the second exemplary embodiment as described above, an amplifier having excellent output matching and flat gain over a wide band can be realized without any increase in circuit area or power consumption. Compared with the first exemplary embodiment, the number of stages of preamplifiers is increased, so that the gain can be flattened over a wider band.

A third exemplary embodiment is now described below. The third exemplary embodiment is a modification of the second exemplary embodiment. And in this third exemplary embodiment, the transistor size of the differential amplifier circuit 52 is modified. That is, each value is set as follows. The gate length of the sixth transistor M6=0.18 um; the gate width of the sixth transistor M6=200 um; the gate length of the fifth transistor M5=0.18 um; the gate width of the fifth transistor M5=300 um; the power supply voltage=1.8 V; the gate voltage of the sixth transistor M6=1.5 V; the gate voltage of the fifth transistor M5=0.75 V; and the operating current=21.6 mA.

It is to be noted that the values set for the preamplifier circuits 32 and 42 of two-stage structure are the same as those in the second exemplary embodiment. That is, each value is set as follows. The gate length of the first transistor M1, the second transistor M2, the third transistor M3 and the fourth transistor M4=0.18 um; the gate width of the first transistor M1, the second transistor M2, the third transistor M3 and the fourth transistor M4=60 um; the power supply voltage=1.8 V; the gate voltage of the first transistor M1 and the third transistor M3=0.75 V; and the gate voltage of the second transistor M2 and the fourth transistor M4=1.8 V. The current flows through the preamplifier circuit 32 and the current flows through the preamplifier circuit 42, thus the total current of about 18 mA flowing through the preamplifier circuits 32 and 42 of two stage structure.

In the third exemplary embodiment, when an output equivalent circuit of the sixth transistor M6 is extracted in the center frequency (geometric average value) of the desired band, which is 5.732 GHz, the source-to-drain resistor Rds is 128.0Ω and the source-to-drain capacitor Cds is 0.308 pF.

It is assumed in the third exemplary embodiment that the desired band is 3.1 to 10.6 GHz. Thus, the circuit constants may be so set as to realize the first inductor L1, the first capacitance C1, the second inductance L2 and the second capacitance C2 given in the above table 2. However, the value of the source-to-drain capacitance Cds is nearly identical to the value of the first capacitor C1. Thus, in this case, the resonant load capacitor Cm need not be used and it suffices if a parallel circuit configured by a resistor and a capacitor connected in parallel with each other is inserted between the drain terminal of the sixth transistor M6 and the power supply terminal. In other words, no resonant load capacitor Cm is used but it is preferred that the resonant load resistor Rm is set to 82.0Ω; the resonant load inductor Lm and the first inductor L1 are set equal to each other and are each set to 2.569 nH; and the second inductor L2 of 0.750 nH and the second capacitor C2 of 1.028 pF are inserted between the drain terminal of the sixth transistor M6 and the output terminal of the output amplifier 120. In consideration of the frequency characteristic of gain, the first load resistance $R_{L1}$, the first load inductor $L_{L1}$, the second load resistance $R_{L2}$ and the second load inductor $L_{L2}$ are set to 40Ω, 1.0 nH, 80Ω and 0.25 nH, respectively, in the load circuits of the preamplifier circuits 32 and 42.

Figure 12:
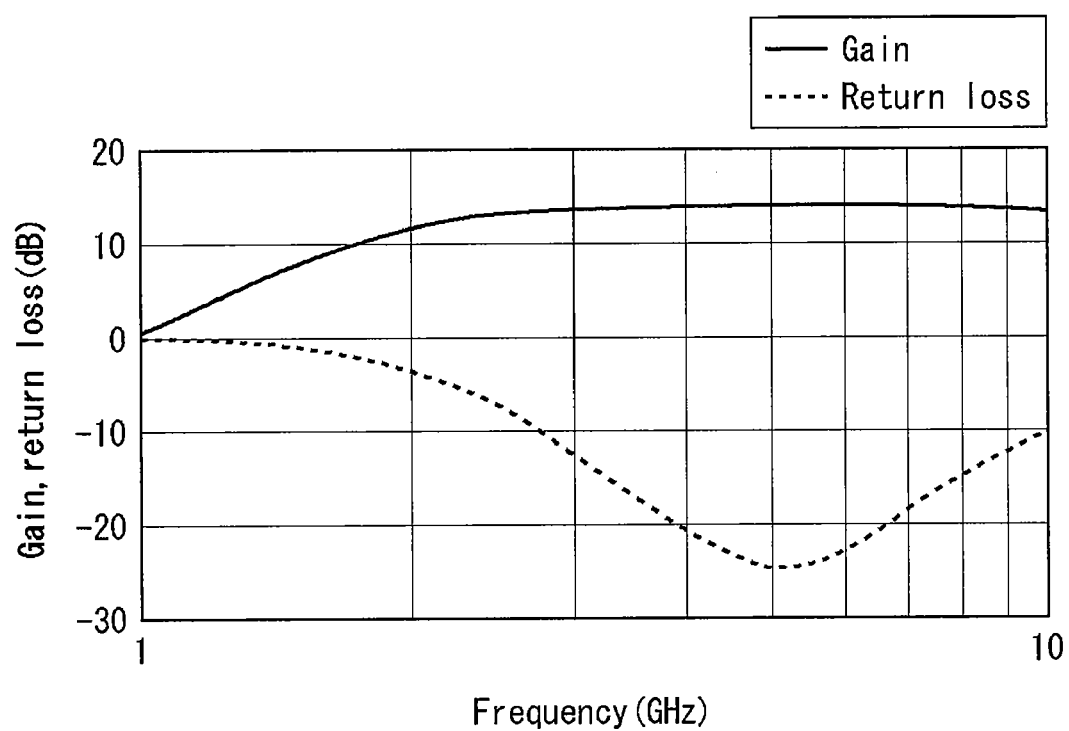
FIG. 12 shows frequency characteristics of an output amplifier according to a third exemplary embodiment.

FIG. 12 shows frequency characteristics of the output amplifier 120 according to the third exemplary embodiment. Referring to FIG. 12, in the frequency range of 3.1 to 10.6 GHz, the gain lies in the range of 13.8 to 12.6 dB, the in-band maximum value is 13.9 dB, the in-band amplitude dispersion is within 1.5 dB, and the return loss is −9.0 dB or below.

By employing the third exemplary embodiment as described above, the same advantageous effects as in the second exemplary embodiment are achieved, by adjusting the sizes of transistors constituting the differential amplifier circuit, without the use of the resonant load capacitor.

Next, a fourth exemplary embodiment is described below. In the fourth exemplary embodiment, the structure of BPF is modified. That is, the BPF between the sixth transistor M6 and the output terminal of the output amplifier is a third-order Chebyshev type BPF.

Figure 13:
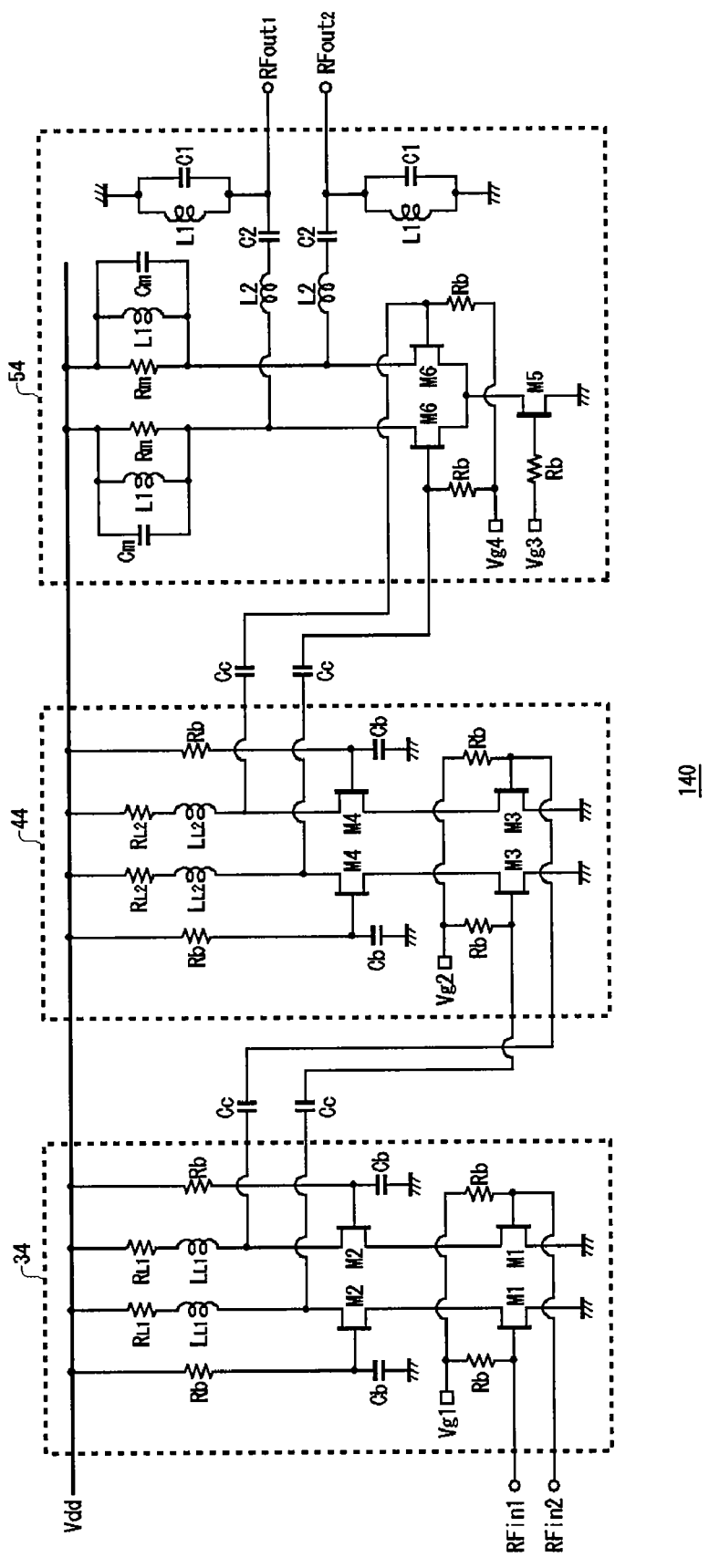
FIG. 13 shows a circuit configuration of an output amplifier loaded with a third-order BPF according to a fourth exemplary embodiment.

FIG. 13 shows a circuit configuration of an output amplifier 140 loaded with a third-order BPF according to a fourth exemplary embodiment. The structure of the output amplifier 140 shown in FIG. 13 is the same as that of the output amplifier 120 shown in FIG. 10 except for the BPF unit. In other words, the output amplifier 140 shown in FIG. 13 is structured such that a parallel circuit configured by the first inductor L1 and the first capacitor C1 connected in parallel to each other is added to the structure of the output amplifier 120 shown in FIG. 10. More specifically, this parallel circuit is connected between a connection point between the second capacitor and the output terminal of the output amplifier 140 and a predetermined first fixed potential, which is the ground in FIG. 13.

The sizes of transistors used in the differential amplifier circuit 54 are the same as those in the third exemplary embodiment. That is, each value is set as follows. The gate length of the sixth transistor M6=0.18 um; the gate width of the sixth transistor M6=200 um; the gate length of the fifth transistor M5=0.18 um; the gate width of the fifth transistor M5=300 um; the power supply voltage Vdd=1.8 V; the gate voltage of the sixth transistor M6=1.5 V; the gate voltage of the fifth transistor M5=0.75 V; and the operating current=21.6 mA.

As for the two-stage preamplifier circuits 34 and 44, each value is set as follows. The gate length of the first transistor M1, the second transistor M2, the third transistor M3 and the fourth transistor M4=0.18 um; the gate width of the first transistor M1, the second transistor M2, the third transistor M3 and the fourth transistor M4=60 um; the power supply voltage=1.8 V; the gate voltage of the first transistor M1 and the third transistor M3=0.75 V; and the gate voltage of the second transistor M2 and the fourth transistor M4=1.8 V. Thus, the total current of about 18 mA flowing through the preamplifier circuits 34 and 44 of two stage structure.

In the fourth exemplary embodiment, a third-order Chebyshev type BPF is taken as an example, where the center frequency $\omega_C$=5.732 GHz, the bandwidth $\omega_{BW}$=7.5 GHz and the ripple value=0.1 dB. In this example, the circuit constants of BPF are listed in the following table 3.

TABLE 3

| Center frequency of BPF | Ripple value | Circuit constants of BPF | Return loss (3.1-10.6 GHz) |
|---|---|---|---|
| 5.732 GHz | 0.1 dB | L1 = 1.761 nH, C1 = 0.438 pF | −12.8 dB or below |
| 7.5 GHz | | L2 = 1.217 nH C2 = 0.633 pF | |

The output equivalent circuit of the sixth transistor M6 is the same as that in the third exemplary embodiment. In this fourth exemplary embodiment, when this output equivalent circuit thereof is extracted in the center frequency (geometric average value) of 5.732 GHz, the source-to-drain resistor Rds is 128.0Ω and the source-to-drain capacitor Cds is 0.308 pF.

The load circuit of the sixth transistor M6 is determined so that the first inductance L1, the first capacitance C1, the second inductance L2 and the second capacitance C2 as given in Table 3 can be achieved. Then the values are set such that the resonant load resistor Rm is 82.04Ω, the resonant load capacitor Cm is 0.1300 pF and the resonant load inductor Lm is 1.761 nH. And the second inductor L2 of 1.217 nH and the second capacitor C2 of 0.633 pF are inserted between the drain terminal of the sixth transistor M6 and the output terminal of the output amplifier 140. At the same time, a parallel circuit configured by the first inductor L1 of 1.791 nH and the first capacitor C1 of 0.438 pF are connected in parallel with each other is inserted between the output terminal of the output amplifier 140 and the ground terminal thereof. In consideration of the frequency characteristic of gain, the first load resistor $R_{L1}$, the first load inductor $L_{L1}$, the second load resistor $R_{L2}$ and the second load inductor $L_{L2}$ are set to 40Ω, 1.0 nH, 80Ω and 0.25 nH, respectively, in the load circuits of the preamplifier circuits 34 and 44.

Figure 14:
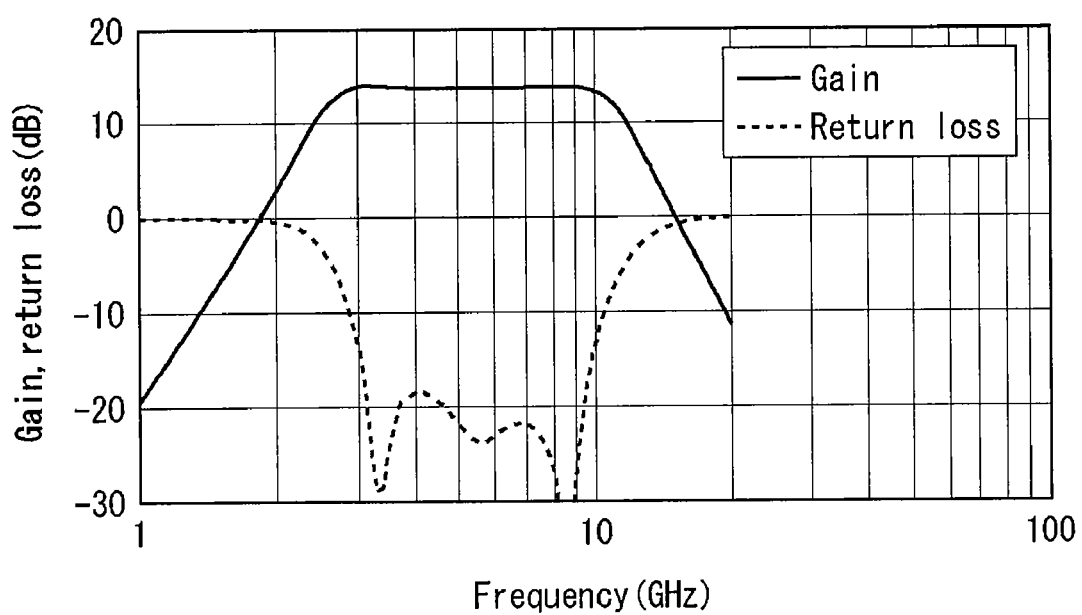
FIG. 14 shows frequency characteristics of an output amplifier according to a fourth exemplary embodiment.

FIG. 14 shows frequency characteristics of the output amplifier 140 according to the fourth exemplary embodiment. Referring to FIG. 14, the gain lies in the range of 14.0 to 12.7 dB and the return loss is −9.9 dB or below in the frequency range of 3.1 to 10.6 GHz.

By employing the fourth exemplary embodiment as described above, an amplifier having excellent output matching and flat gain over a wide band can be achieved without causing the increase in circuit area or power consumption. The fourth exemplary embodiment can apply to not only a second-order BPF but also a third-order BPF.

Figure 15:
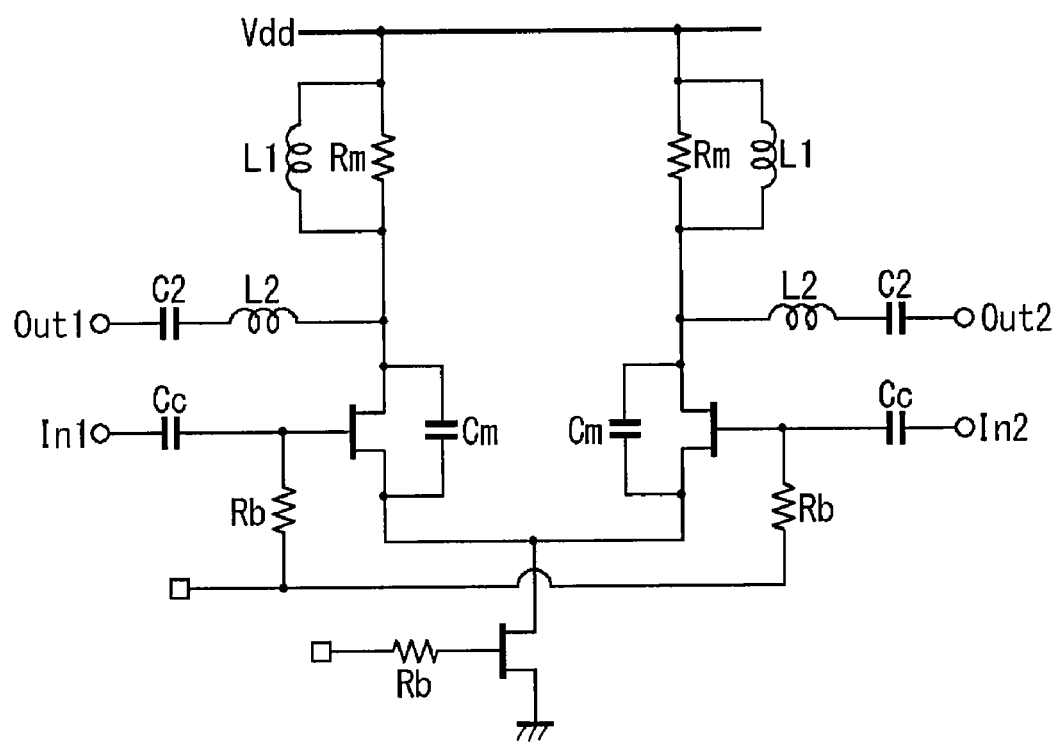
FIG. 15 shows a configuration of a differential amplifier circuit according to a fifth exemplary embodiment.

FIG. 15 shows a configuration of a differential amplifier circuit 55 according to a fifth exemplary embodiment. In the first to fourth exemplary embodiments, the resonant load capacitor Cm is inserted between the sixth transistor and the power supply terminal. In this regard, a capacitance corresponding to the resonant load capacitor Cm may be inserted between the drain terminal and the source terminal of the sixth transistor M6. This structure may be used for the differential amplifier circuits according to the first to fourth exemplary embodiments.

In the differential amplifier circuit 55 as shown in FIG. 15, the resonant load inductor Lm (L1) and the resonant load resistor Rm are inserted between the drain terminal of the sixth transistor M6 and the power supply terminal, so that the circuit configuration can be separated into an L-R parallel circuit and C in an actual layout placement. This can be derived easily from FIG. 3 which illustrates the fundamentals of output matching.

In an RFIC layout design, a spiral inductor whose area has a square of about 200 to 300 um is generally used as an inductor, whereas an MIM (Metal Insulator Metal) capacitor whose area has a square of more than ten to several tens um is used as a capacitor. When the layout of such elements having different sizes is designed, the fact that the places of the elements to be inserted differ can contribute to increasing the degree of freedom.

By employing the fifth exemplary embodiment as described above, the degree of freedom in circuit design can be increased in addition to achieving the advantageous effects in any of the first to fourth exemplary embodiments.

A large capacitance value of, for example, about 10 pF in a GHz band may be used for a coupling capacitor Cc and a bypass capacitor Cb in the first to fifth exemplary embodiments. Also, the bias resistor Rb is a resistor used for the application of a bias voltage, and a high resistance of, for example, about 2 kΩ may be used.

In the above exemplary embodiments, actual high-frequency models are used for FETs, whereas the inductors, capacitors and resistors employed in the matching circuit and load circuit are treated as ideal elements. In the actual setting, those elements are affected by some constrains due to the element producing process or parasitic components, which are design-oriented matters and therefore does not change the fact that the fundamentals underlying the embodiments of the present invention are still applicable.

The description of the invention given above is based upon illustrative embodiments. These exemplary embodiments are intended to be illustrative only and it will be obvious to those skilled in the art that various modifications to constituting elements and processes could be developed and that such modifications are also within the scope of the present invention.

In the above-described exemplary embodiments, a description has been given of cases where the output matching circuit is provided with the second-order Butterworth type BPF or third-order Chebyshev type BPF. Using the BPF of a higher or lower order or having other band-pass characteristics can realize the similar structure and advantages as achieved by the present exemplary embodiments and their modifications. The same also applies to when the values of the reference impedance or constituent elements of a BPF are changed. As for active elements, not only FET but also bipolar transistors may be used. In such a case, "source terminal", "gate terminal" and "drain terminal" may be replaced by "emitter terminal", "base terminal" and "collector terminal", respectively. Also, the signal inputted to the base terminal will then be a current value.

The FET may be of a single configuration instead of a differential configuration. In this case, the power supply terminal needs to be grounded in terms of alternating current, using a bypass capacitor. As still another modification, a low resistance component or inductance component may be provided between a source terminal of a common-source transistor and the first predetermined fixed potential in the above-described common-source transistors. As a result, the common-source transistors can be stabilized and the performance of circuitry can be optimally adjusted. Further, the present exemplary embodiments are applicable to not only the amplifier but also other high-frequency circuits, such as a mixer using a differential structure, which output GHz-band signals.

While the preferred embodiments of the present invention and the modifications to the embodiments have been described using specific terms, such description is for illustrative purposes only, and it is to be understood that changes and variations may further be made without departing from the spirit or scope of the appended claims.

What is claimed is:

1. A high frequency circuit, comprising:
   a transistor wherein the potential of a source terminal thereof is fixed and an input signal is received by a gate terminal thereof;
   a load connected between a drain terminal of said transistor and a ground terminal or a power supply terminal;
   a series circuit, including an inductor and a capacitor connected in series, provided between a connection point of the drain terminal of said transistor and said load and an output terminal of the high-frequency circuit, wherein a band-pass filter having a predetermined characteristic is configured by an output equivalent circuit expressing an output impedance of said transistor, said load, and said series circuit; and
   a parallel circuit which includes an inductor and a capacitor connected in parallel, wherein said parallel circuit is provided between the output terminal and a predetermined fixed potential.

2. A high-frequency circuit according to claim 1, wherein said load includes a resistor, an inductor and a capacitor connected in parallel, and
   wherein the output equivalent circuit is approximated to a parallel circuit including a resistor and a capacitor connected in parallel.

3. A high-frequency circuit according to claim 1, wherein said load includes a resistor, an inductor and a capacitor connected in parallel, and
   wherein the output equivalent circuit is approximated to a parallel circuit including a resistor and a capacitor connected in parallel.

4. A high-frequency circuit according to claim 1, wherein said load includes a resistor and an inductor connected in parallel, and
   wherein the output equivalent circuit is approximated to a parallel circuit including a resistor and a capacitor connected in parallel.

5. A high-frequency circuit according to claim 1, wherein said load includes a resistor and an inductor connected in parallel, and
   wherein the output equivalent circuit is approximated to a parallel circuit including a resistor and a capacitor connected in parallel.

6. A high-frequency circuit according to claim 1, wherein a capacitor is connected between the source terminal and the drain terminal of said transistor, and
   wherein said load includes a resistor and an inductor connected in parallel, and
   wherein the output equivalent circuit is approximated to a parallel circuit including a resistor and a capacitor connected in parallel.

7. A high-frequency circuit according to claim 1, wherein a capacitor is connected between the source terminal and the drain terminal of said transistor, and
   wherein said load includes a resistor and an inductor connected in parallel, and
   wherein the output equivalent circuit is approximated to a parallel circuit including a resistor and a capacitor connected in parallel.

8. A high-frequency circuit according to claim 1, further comprising a preamplifier, having at least one stage, which includes an inductive load before said transistor, wherein the inductive load includes an inductor and a resistor connected in series.

9. A high-frequency circuit according to claim 1, wherein the potential of the source terminal is fixed to a ground in terms of alternating current.

10. A high-frequency circuit, comprising:
    a pair of differential transistors wherein source terminals thereof are grounded in terms of alternating current and differential input signals are received by gate terminals thereof, respectively;
    loads connected to drain terminals of said pair of differential transistors; and
    series circuits, each including an inductor and a capacitor connected in series, provided between connection points of drain terminals of said pair of differential transistors and said loads and differential output terminals of the high-frequency circuit,
    wherein band-pass filters having predetermined characteristics are configured by output equivalent circuits expressing output impedances of said pair of differential transistors, said loads, and said series circuits.

11. A high-frequency circuit according to claim 10, further comprising a preamplifier, having at least one stage, which includes an inductive load before said transistor, wherein the inductive load includes an inductor and a resistor connected in series.

12. A high-frequency circuit, comprising:
    a transistor wherein the potential of an emitter terminal thereof is fixed and an input signal is received by a base terminal thereof;
    a load connected between a collector terminal of said transistor and a ground terminal or a power supply terminal;
    a series circuit, including an inductor and a capacitor connected in series, provided between a connection point of the collector terminal of said transistor and said load and an output terminal of the high-frequency circuit, wherein a band-pass filter having a predetermined characteristic is configured by an output equivalent circuit expressing an output impedance of said transistor, said load, and said series circuit; and
    a preamplifier, having at least one stage, which includes an inductive load before said transistor, wherein the inductive load includes an inductor and a resistor connected in series.

13. A high-frequency circuit according to claim 12, further comprising a preamplifier, having at least one stage, which includes an inductive load before said transistor, wherein the inductive load includes an inductor and a resistor connected in series.

14. A high-frequency circuit according to claim 12, wherein the potential of the emitter terminal is fixed to a ground in terms of alternating current.

* * * * *